US011621488B2

(12) United States Patent
Oshima

(10) Patent No.: US 11,621,488 B2
(45) Date of Patent: Apr. 4, 2023

(54) ARRAY COMMUNICATION DEVICE AND METHOD FOR CONTROLLING SAME

(71) Applicant: NEC CORPORATION, Tokyo (JP)

(72) Inventor: Naoki Oshima, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 17/052,637

(22) PCT Filed: May 14, 2019

(86) PCT No.: PCT/JP2019/019152
§ 371 (c)(1),
(2) Date: Nov. 3, 2020

(87) PCT Pub. No.: WO2019/221130
PCT Pub. Date: Nov. 21, 2019

(65) Prior Publication Data
US 2021/0111489 A1    Apr. 15, 2021

(30) Foreign Application Priority Data
May 17, 2018   (JP) .............................. JP2018-095602

(51) Int. Cl.
*H01Q 3/36* (2006.01)
*H04B 7/06* (2006.01)
*H04B 7/08* (2006.01)

(52) U.S. Cl.
CPC ................. *H01Q 3/36* (2013.01); *H04B 7/06* (2013.01); *H04B 7/08* (2013.01)

(58) Field of Classification Search
CPC ... H01Q 3/36; H04B 7/06; H04B 7/08; H04B 7/086; H04B 7/0617; G01R 29/26; G01R 35/00
See application file for complete search history.

(56) References Cited

U.S. PATENT DOCUMENTS

| 6,320,540 B1 * | 11/2001 | Meredith | ................ H01Q 3/26 342/174 |
| 6,356,233 B1 * | 3/2002 | Miller | .................... H01Q 3/267 342/174 |
| 2006/0286940 A1 | 12/2006 | Izumi et al. | |

FOREIGN PATENT DOCUMENTS

| JP | 2001-330660 A | 11/2001 |
| JP | 2002-353865 A | 12/2002 |

(Continued)

OTHER PUBLICATIONS

Moon-Kyu Cho, et al., "A Switchless CMOS Bi-Directional Distributed Gain Amplifier With Multi-Octave Bandwidth", IEEE Microwave and Wireless Components Letters, Nov. 2013, pp. 611-613, vol. 23, No. 11.

(Continued)

*Primary Examiner* — Kabir A Timory
(74) *Attorney, Agent, or Firm* — Sughrue Mion, PLLC

(57) ABSTRACT

Provided are an array communication device that makes phase correction between a plurality of arrays having bi-directional amplifiers possible and a method for controlling the array communication device. This array communication device comprises a plurality of array units that are connected to a common signal processing unit and each comprise an antenna, amplifier, and phase shifter. The array communication device further comprises first-directional couplers that are respectively disposed between the antennas and amplifiers of the array units and divide or combine signals, second-directional couplers that are respectively disposed between the phase shifters of the array units and the signal processing unit and divide or combine signals, and phase comparison means that each receive at least one from among a signal from a first-directional coupler and a signal from a second-directional coupler and a signal serving as a phase reference and carry out phase comparison and correction.

11 Claims, 5 Drawing Sheets

(56) References Cited

FOREIGN PATENT DOCUMENTS

| | | |
|---|---|---|
| JP | 2004-320367 A | 11/2004 |
| JP | 2006-094423 A | 4/2006 |
| JP | 2006-304205 A | 11/2006 |
| JP | 2017-212594 A | 11/2017 |
| WO | 2015/145993 A1 | 10/2015 |
| WO | 2016/167145 A1 | 10/2016 |
| WO | 2018/109871 A1 | 6/2018 |

OTHER PUBLICATIONS

International Search Report for PCT/JP2019/019152 dated Jul. 30, 2019 [PCT/ISA/210].
Written Opinion for PCT/JP2019/019152 dated Jul. 30, 2019 [PCT/ISA/237].
JP Office Action for JP Application No. 2020-519861, dated Dec. 5, 2022 with English Translation.

* cited by examiner

ARRAY COMMUNICATION DEVICE AND METHOD FOR CONTROLLING SAME

CROSS REFERENCE TO RELATED APPLICATIONS

This application is a National Stage of International Application No. PCT/JP2019/019152 filed May 14, 2019, claiming priority based on Japanese Patent Application No. 2018-095602 filed May 17, 2018, the entire disclosure of which is incorporated herein.

TECHNICAL FIELD

The present invention relates to an array communication device and a method for controlling the same and particularly relates to a phase calibration method and the like in an array communication device.

BACKGROUND ART

With rapid spread of wireless communication, shortage of frequency bands used for wireless communication has become a problem. Technologies effectively using frequency bands include beam forming. The beam forming is a technology allowing wireless communication by a predetermined communication target by emitting a radio wave with directivity and is a technology capable of suppressing interference in another wireless system or the like while maintaining signal quality.

Typical techniques for achieving beam forming include a phased array. The phased array is a technology of boosting a signal in a desired direction by adjusting phases of wireless signals fed to a plurality of antenna elements in a transmitter and combining radio waves emitted from the antenna elements in space. In order to adjust phases of wireless signals fed to a plurality of antenna elements in a transmitter, phase variation caused by substrate wiring and/or the like needs to be calibrated, and a phase change and/or an amplitude change occurring in the transmitter need to be accurately monitored.

Patent Literature 1 (PTL1) and Patent Literature 2 (PTL2) disclose technologies related to the phased array as related technologies.

Means for monitoring a phase change and/or an amplitude change occurring in a transmitter in a transmitter-receiver using the phased array technology includes a technology using loopback. The technology using loopback is a technology of monitoring a phase change and/or an amplitude change by inputting part of an output signal of a transmitter to a receiver. In order to accurately monitor a phase change and/or an amplitude change occurring in a transmitter in a transmitter-receiver using the loopback technology, a phase difference and/or an amplitude difference between antenna elements in a receiver in the transmitter-receiver using the loopback technology needs to be accurately calibrated. Patent Literature 3 (PTL3) is not related to the phased array but proposes a technology of looping back a high-frequency signal transmitted by a high-frequency signal transmission means in a wireless device to a high-frequency signal reception means.

On the other hand, the phased array requires a plurality of antenna elements and therefore assuming that one antenna element is configured to be connected to one set of transmitter-receiver, there is a problem that as many transmitter-receivers as the antenna elements are required, an entire communication device size increases, and a device cost increases.

On the other hand, there is a bi-directional configuration in which an amplifier and the like are shared between transmission and reception. Non Patent Literature 1 (NPL1) proposes a bi-directional amplifier (BDA) in which an amplifier and the like are shared between transmission and reception by combining a single amplifier with four switches. Further, for example, in the bi-directionally configured amplifier proposed in NPL1, a power amplifier (PA) in a transmitter and a low noise amplifier (LNA) in a receiver can be integrated, and thus downsizing can be expected.

FIG. 5 is a block diagram for illustrating an array communication device based on the background art and illustrates a phased array using a bi-directionally configured amplifier based on the background art. The array communication device in FIG. 5 includes a plurality of array units such as a first array unit 1004 and a second array unit 1008, and a control unit 1009. The first array unit 1004 includes an antenna 1001, an amplifier 1002, and a phase shifter 1003, and the second array unit 1008 includes an antenna 1005, an amplifier 1006, and a phase shifter 1007. The control unit 1009 controls amplifiers in the plurality of array units, such as the amplifier 1002 and the amplifier 1006, and phase shifters in the plurality of array units, such as the phase shifter 1003 and the phase shifter 1007. An output of the first array unit 1004 and an output of the second array unit 1008 are transmitted to an unillustrated signal processing unit.

CITATION LIST

Patent Literature

[PTL1] Japanese Patent Application Laid-Open No. 2001-330660
[PTL2] International Application Publication No. WO 2016/167145
[PTL3] International Application Publication No. WO 2015/145993

Non Patent Literature

[NPL1] Moon-Kyu Cho et al., "A Switchless CMOS Bi-Directional Distributed Gain Amplifier With Multi-Octave Bandwidth," IEEE Microwave and Wireless Components Letters, Vol. 23, No. 11, pp. 611 to 613, 2013

SUMMARY OF INVENTION

Technical Problem

However, the array communication device described above has the following problem. An amplifier and the like are shared between transmission and reception in a bi-directionally configured array communication device, and therefore transmission and reception cannot be performed simultaneously. In other words, loopback or the like cannot be used for phase calibration between arrays in the array communication device.

It is assumed in the array communication device in FIG. 5 that a loopback is performed with the first array unit 1004 on the transmitting side and the second array unit 1008 side on the receiving side. In this case, when a signal transmitted from the amplifier 1002 is received by the amplifier 1006, the received signal is amplified by the amplifier 1002 again through a distributor, which results in oscillation, even in a case of excluding the need for adding a signal path between arrays, that is, the first array unit 1004 and the second array unit 1008, or passing a signal through the antenna 1001 and the antenna 1005. Accordingly, the array communication device with the configuration in FIG. 5 has a problem that loopback cannot be used for phase calibration between arrays.

An object of the present invention is to provide an array communication device including bi-directionally configured amplifiers and enabling phase calibration between a plurality of arrays, and a method for controlling the same.

Solution to Problem

In order to achieve the aforementioned object, an array communication device according to the present invention comprises:

a plurality of array units connected to a signal processing unit in common, each of the aforementioned array units including an antenna, an amplifier, and a phase shifter;

a first directional coupler placed between the aforementioned antenna and the aforementioned amplifier in the aforementioned array unit and branching or merging a signal;

a second directional coupler placed between the aforementioned phase shifter in the aforementioned array unit and the aforementioned signal processing unit and branching or merging a signal; and a phase comparison means for comparing a phase of at least one of signals from the aforementioned first directional coupler and the aforementioned second directional coupler with a phase of a phase reference signal, the signals input to the phase comparison means, and calibrating a phase.

An array communication device control method according to the present invention is for controlling an array communication device including:

a plurality of array units connected to a signal processing unit in common, each of the aforementioned array units having an antenna, an amplifier, and a phase shifter;

a first directional coupler placed between the aforementioned antenna and the aforementioned amplifier in the aforementioned array unit and branching a signal; and a second directional coupler placed in the aforementioned array unit and between the aforementioned phase shifter in the aforementioned array unit and the aforementioned signal processing unit and branching part of a signal, the method comprises comparing a phase of at least one of input signals from the aforementioned first directional coupler and the aforementioned second directional coupler with a phase of an input phase reference signal and calibrating a phase, based on a comparison result.

Advantageous Effects of Invention

The present invention can achieve phase calibration between arrays in an array communication device including a plurality of array units each including a bi-directionally configured amplifier.

EXAMPLE EMBODIMENT

Figure 1:
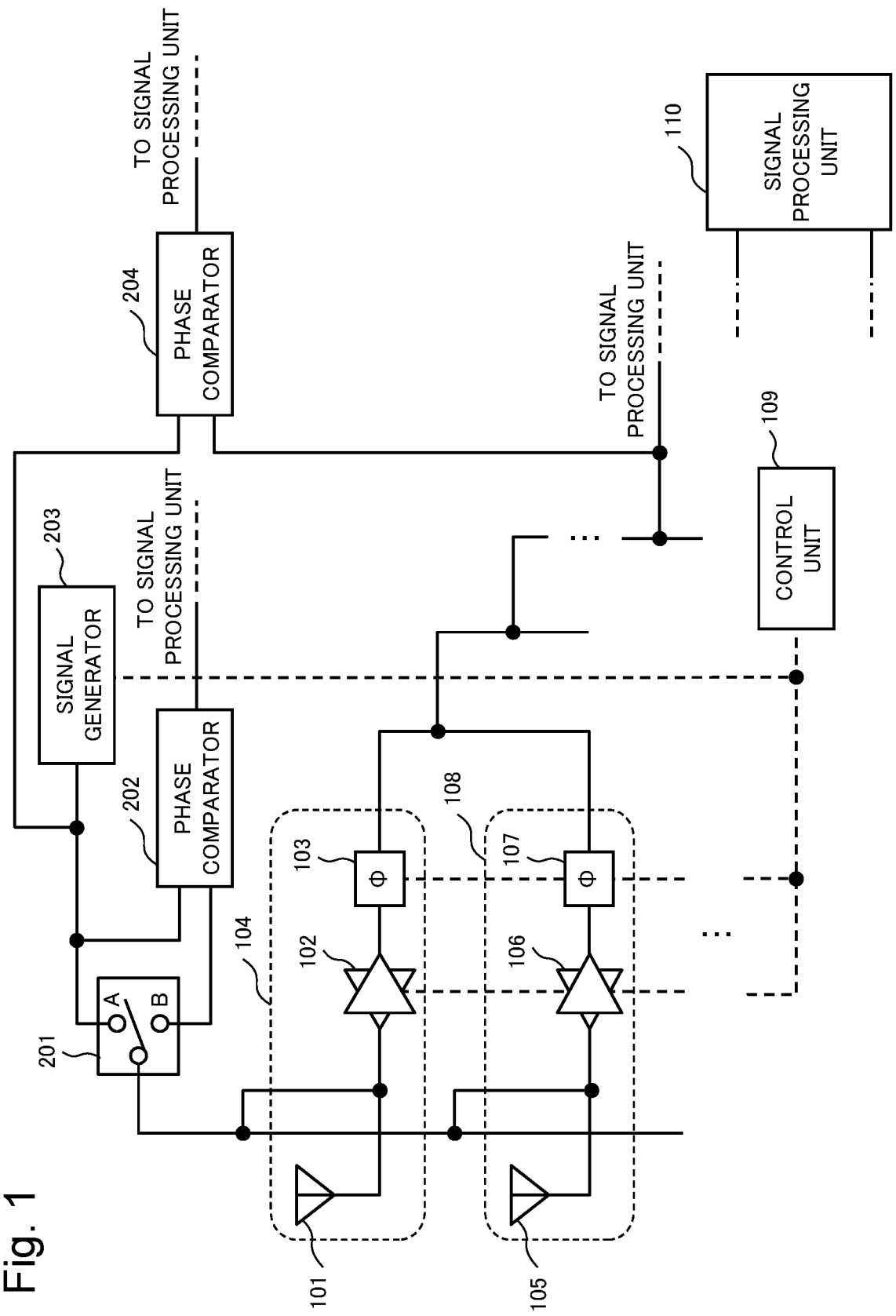
FIG. 1 is a block diagram for illustrating an example of an array communication device according to an example embodiment based on a superordinate concept of the present invention.

Preferred example embodiments of the present invention will be described with reference to drawings. Prior to description of more specific example embodiments, an array communication device according to an example embodiment based on a superordinate concept, and a method for controlling the same will be described. FIG. 1 is a block diagram of an example of the array communication device according to the example embodiment based on the superordinate concept.

(Description of Configuration)

The array communication device in FIG. 1 includes a first array unit 104 and a second array unit 108 connected to a signal processing unit 110 in common, each of the first array unit 104 and the second array unit 108 including an antenna, an amplifier, and a phase shifter. In FIG. 1, the first array unit 104 includes an antenna 101, an amplifier 102, and a phase shifter 103, and the second array unit 108 includes an antenna 105, an amplifier 106, and a phase shifter 107.

The array communication device in FIG. 1 further includes a phase comparator 202 as an example of a first phase comparator comparing a phase of a signal branched from between the antenna and the amplifier in the first array unit 104 or the second array unit 108 with a phase of a phase reference signal. The array communication device in FIG. 1 further includes a phase comparator 204 as an example of a second phase comparator comparing a phase of the signal branched from between the antenna and the amplifier in the first array unit 104 or the second array unit 108 with a phase of a signal branched from between the first array unit 104 and the second array unit 108, and the signal processing unit 110.

The array communication device in FIG. 1 further includes a signal generator 203 outputting the aforementioned phase reference signal to the phase comparator 202 or the phase comparator 204. The array communication device in FIG. 1 further includes a single-pole/double-throw switch 201 switching a destination of the signal branched from between the antenna and the amplifier in the first array unit 104 or the second array unit 108 to the phase comparator 202 or the phase comparator 204. The single-pole/double-throw switch is hereinafter referred to as an SPDT switch.

The array communication device in FIG. 1 further includes a control unit 109 controlling the amplifier 102 and the phase shifter 103 in the first array unit 104, the amplifier 106 and the phase shifter 107 in the second array unit 108, and the signal generator 203. The control unit 109 controls an operation, a stop, or the like of each of the amplifier 102 and the phase shifter 103 in the first array unit 104, the amplifier 106 and the phase shifter 107 in the second array unit 108, and the signal generator 203.

While the array communication device in FIG. 1 is described to include the signal generator 203, the array communication device may not include a signal generator, and a phase reference signal may be supplied from outside the array communication device.

(Description of Operation)

Next, a phase calibration operation in an operation of the array communication device in FIG. 1 will be described.

First, a case of performing transmission phase calibration in the array communication device in FIG. 1 will be described. During phase calibration, a signal transmitted to the first array unit 104 and the second array unit 108 is transmitted from the antenna 101 and the antenna 105 through the phase shifter 103, the phase shifter 107, the amplifier 102, and the amplifier 106. Part of the signal, that is, a signal branched from between the antenna 101 and the amplifier 102, or a signal branched from between the antenna 105 and the amplifier 106 is output to the SPDT switch 201 through the distributor/combiner.

During the transmission phase calibration, the SPDT switch 201 outputs the input signal to the phase comparator 202 (output to a lower contact B in FIG. 1). The signal generator 203 transmits a known phase reference signal. The phase difference between the arrays can be detected by comparing the signal branched from between the antenna 101 and the amplifier 102, or the signal branched from between the antenna 105 and the amplifier 106 with the phase reference signal from the signal generator 203 by the phase comparator 202.

Next, a case of performing reception phase calibration in the array communication device in FIG. 1 will be described. During phase calibration, a known phase reference signal from the signal generator 203 is output to the SPDT switch 201. During the reception phase calibration, the SPDT switch 201 transmits the aforementioned phase reference signal from the signal generator 203 to the first array unit 104 and the second array unit 108 (electrically continuous with an upper contact A in FIG. 1). The signals received by the first array unit 104 and the second array unit 108 are output to the signal processing unit 110 through the amplifier 102, the amplifier 106, the phase shifter 103, the phase shifter 107, and the like.

By inputting the known phase reference signal from the signal generator 203 and a signal branched from between the first array unit 104 and the second array unit 108, and the signal processing unit 110 to the phase comparator 204, the signals are compared. This enables detection of the phase difference between the arrays. The phase comparator 202 is not used in the reception phase calibration and therefore may be stopped. Switches may be provided in stages preceding the antennas 101 and 105, respectively, in order to avoid transmission of the signal from the signal generator 203 from the antenna 101 and the antenna 105.

(Description of Advantageous Effects)

The array communication device in FIG. 1 can perform phase/amplitude calibration between arrays for each of the transmission operation and the reception operation of the bi-directionally configured array communication device. Use of the phase comparator 202 and the signal generator 203 transmitting a known phase reference signal particularly enables phase calibration in the transmission operation of the bi-directionally configured array communication device, and use of the phase comparator 204 and the signal generator 203 enables phase calibration in the reception operation of the bi-directionally configured array communication device.

With such a configuration, a device size of the bi-directionally configured array communication device capable of phase/amplitude calibration between arrays can be reduced. More specific example embodiments will be described below.

First Example Embodiment

Figure 2:
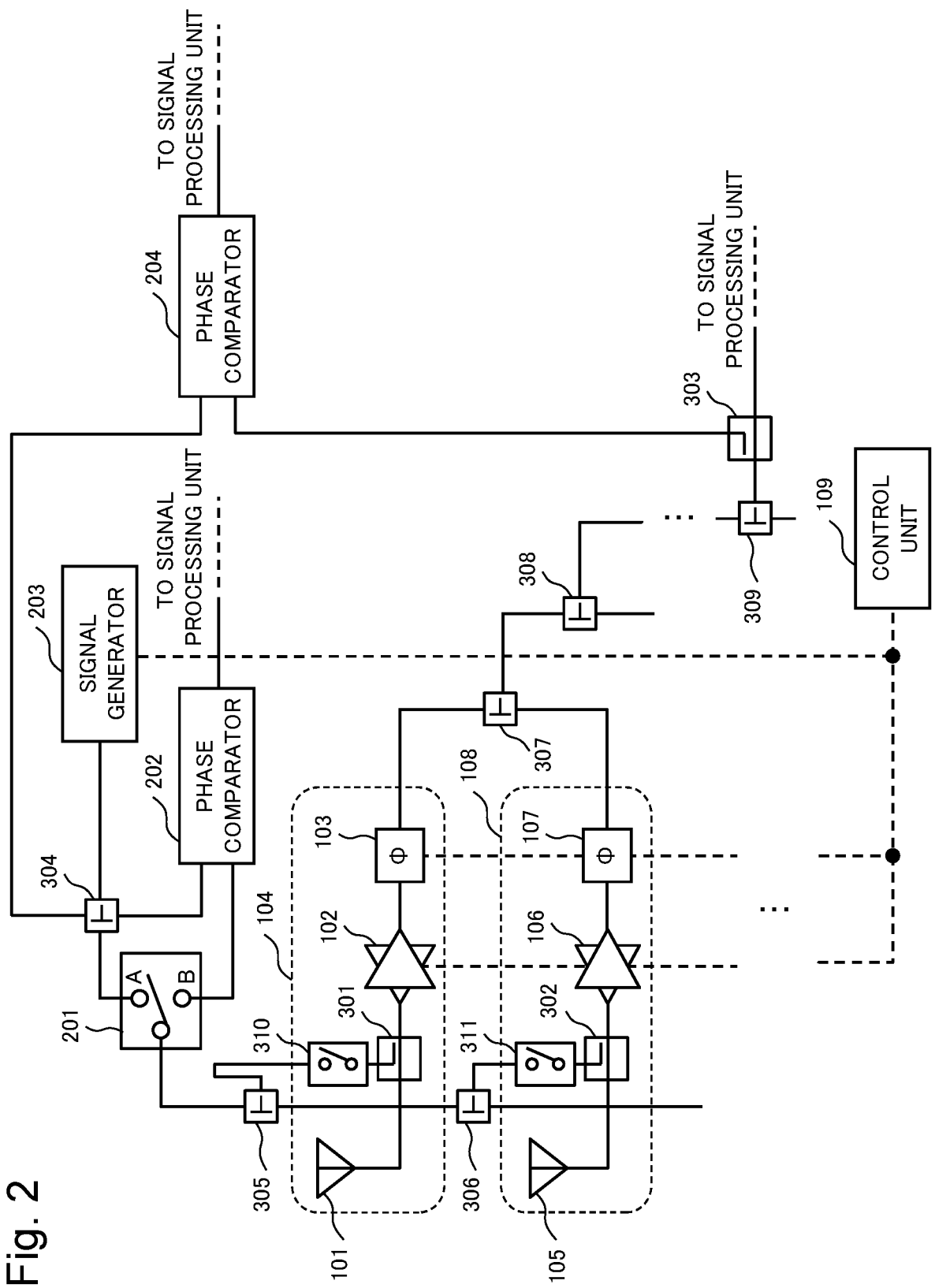
FIG. 2 is a block diagram for illustrating an array communication device according to a first example embodiment.

Next, an array communication device according to a first example embodiment and a method for controlling the same will be described. FIG. 2 is a block diagram for illustrating the array communication device according to the first example embodiment. A component similar to that in the array communication device in FIG. 1 is given the same reference numeral, and detailed description thereof is omitted.

(Description of Configuration)

The array communication device in FIG. 2 includes a first array unit 104 and a second array unit 108 connected to a signal processing unit in common, each of the first array unit 104 and the second array unit 108 including an antenna, an amplifier, and a phase shifter. In FIG. 2, the first array unit 104 includes an antenna 101, an amplifier 102, and a phase shifter 103, and the second array unit 108 includes an antenna 105, an amplifier 106, and a phase shifter 107.

The array communication device in FIG. 2 further includes a directional coupler 301 and a directional coupler 302 as examples of a first directional coupler being placed between the antenna and the amplifier in the first array unit 104 or the second array unit 108, and branching or merging a signal. The array communication device in FIG. 2 further includes a directional coupler 303 as an example of a second directional coupler being placed between the phase shifter in the first array unit 104 or the second array unit 108, and the signal processing unit and branching or merging a signal.

The array communication device in FIG. 2 further includes a phase comparator 202 as an example of a first phase comparator and a phase comparator 204 as an example of a second phase comparator. The phase comparator 202 and the phase comparator 204 are used for phase calibration of a plurality of array units calibrating the array communication device in FIG. 2. The array communication device in FIG. 2 further includes a signal generator 203 outputting the aforementioned phase reference signal to the phase comparator 202 or the phase comparator 204. The array communication device in FIG. 2 further includes a single-pole/double-throw switch (SPDT switch) 201 switching a destination of a signal branched from the directional coupler 301 in the first array unit 104 or the directional coupler 302 in the second array unit 108 to the phase comparator 202 or the phase comparator 204.

The array communication device in FIG. 2 further includes a specific configuration for branching or merging a signal. Specifically, the array communication device in FIG. 2 includes a distributor/combiner 304, a distributor/combiner 305, a distributor/combiner 306, a distributor/combiner 307, a distributor/combiner 308, and a distributor/combiner 309 placed at points where signals are merged or branched. For example, the distributor/combiner 304 is installed between the SPDT switch 201, the phase comparator 202, the signal generator 203, and the phase comparator 204. For example, the distributor/combiner 305 is installed between the SPDT switch 201 and the first array unit 104, and the distributor/combiner 306 is installed between the SPDT switch 201 and the second array unit 108. The distributor/combiner 307 is placed between the first array unit 104 and the second array unit 108, and the signal processing unit, and the distributor/combiner 308 is placed between the distributor/combiner 307 and another array unit (unillustrated), and the signal processing unit. The distributor/combiner 309 is placed between the distributor/combiner 308 and yet another array unit (unillustrated), and the signal processing unit.

The array communication device in FIG. 2 further includes a switch 310 placed between the distributor/combiner 305 and a coupling port of the directional coupler 301, and a switch 311 placed between the distributor/combiner 306 and a coupling port of the directional coupler 302.

The array communication device in FIG. 2 further includes a control unit 109 controlling the amplifier 102 and the phase shifter 103 in the first array unit 104, the amplifier 106 and the phase shifter 107 in the second array unit 108, and the signal generator 203, similarly to the array communication device in FIG. 1. The control unit 109 also controls amplifiers and phase shifters in other unillustrated array units. The control unit 109 controls an operation, a stop, or the like of each of the amplifier 102 and the phase shifter 103 in the first array unit 104, the amplifier 106 and the phase shifter 107 in the second array unit 108, the amplifiers and the phase shifters in the other unillustrated array units, and the signal generator 203.

The array communication device in FIG. 2 has a bi-directional configuration in which an amplifier and the like are shared between transmission and reception. For example, a configuration in which an amplifier is shared between transmission and reception can be provided by a combination of a single amplifier and four switches as illustrated in FIG. 1(c) in NPL1. For example, by controlling on/off states of the four switches by control signals from the control unit 109, control such as using the single amplifier for transmission, using the single amplifier for reception, or stopping output can be performed.

(Description of Operation)

Next, a phase calibration operation and an array communication device control method in an operation of the array communication device in FIG. 2 will be described.

First, a case of performing transmission phase calibration in the array communication device in FIG. 2 will be described. During phase calibration, a signal transmitted to the first array unit 104 and the second array unit 108 is transmitted from the antenna 101 and the antenna 105 through the phase shifter 103, the phase shifter 107, the amplifier 102, and the amplifier 106. Part of the signal, that is, a signal branched from the directional coupler 301 between the antenna 101 and the amplifier 102, or a signal branched from the directional coupler 302 between the antenna 105 and the amplifier 106 is output to the SPDT switch 201.

During the transmission phase calibration, the SPDT switch 201 outputs the input signal to the phase comparator 202 (output to a lower contact B in FIG. 2). The signal generator 203 transmits a known phase reference signal. The phase difference between the arrays can be detected by comparing a signal branched from the directional coupler 301 between the antenna 101 and the amplifier 102, or a signal branched from the directional coupler 302 between the antenna 105 and the amplifier 106 with the phase reference signal from the signal generator 203 by the phase comparator 202.

In the case of the transmission phase calibration, output signal strength of the amplifier 102 and the amplifier 106 is high, and therefore distribution to the phase comparator 202 may only be partial. Accordingly, by using the directional coupler 301 and the directional coupler 302, adjustment of signal strength output to the phase comparator and loss of signal strength transmitted to the antennas 101 and 105 can be reduced.

Furthermore, by turning on either one of the switch 310 in the first array unit 104 and the switch 311 in the second array unit 108, one signal out of signals output to the SPDT switch 201 from a plurality of array units can be selected, and the phase comparator 202 can make a phase comparison for each array.

Next, a case of performing reception phase calibration in the array communication device in FIG. 2 will be described. The directional coupler 303 is used for the reception phase calibration. During phase calibration, a known phase reference signal from the signal generator 203 is output to the SPDT switch 201. During the reception phase calibration, the SPDT switch 201 transmits the aforementioned phase reference signal from the signal generator 203 to the first array unit 104 and the second array unit 108 through the distributors/combiners (electrically continuous with an upper contact A in FIG. 2). The signals received by the first array unit 104 and the second array unit 108 are output to an unillustrated signal processing unit through the amplifier 102, the amplifier 106, the phase shifter 103, the phase shifter 107, the distributor/combiner 307, and the like. At this time, by inputting part of the signal from the directional coupler 303 to the phase comparator 204, the signals from the signal generator 203 are compared. Consequently, the phase difference between the arrays can be detected.

It is desirable in detection of the phase difference between the arrays that a path length from the distributor/combiner 305 to the directional coupler 301 in the array communication device in FIG. 2 be equal to a path length from the distributor/combiner 305 to the directional coupler 302. FIG. 2 illustrates a case that a path length between the distributor/combiner 305 and the switch 310 is longer than a path length between the distributor/combiner 306 and the switch 311, as an example of an intent to equalize the path lengths. By such a path length setting, the path length from the distributor/combiner 305 to the directional coupler 301 in the first array unit 104 and the path length from the distributor/combiner 305 to the directional coupler 302 in the second array unit 108 can be equalized.

(Description of Advantageous Effects)

The array communication device in FIG. 2 can perform phase/amplitude calibration between arrays for each of the transmission operation and the reception operation of the bi-directionally configured array communication device. Use of the phase comparator 202 and the signal generator 203 transmitting a known phase reference signal particularly enables phase calibration in the transmission operation of the bi-directionally configured array communication device, and use of the phase comparator 204 and the signal generator 203 enables phase calibration in the reception operation of the bi-directionally configured array communication device.

With such a configuration, a device size of the bi-directionally configured array communication device capable of phase/amplitude calibration between arrays can be reduced.

Second Example Embodiment

Figure 3:
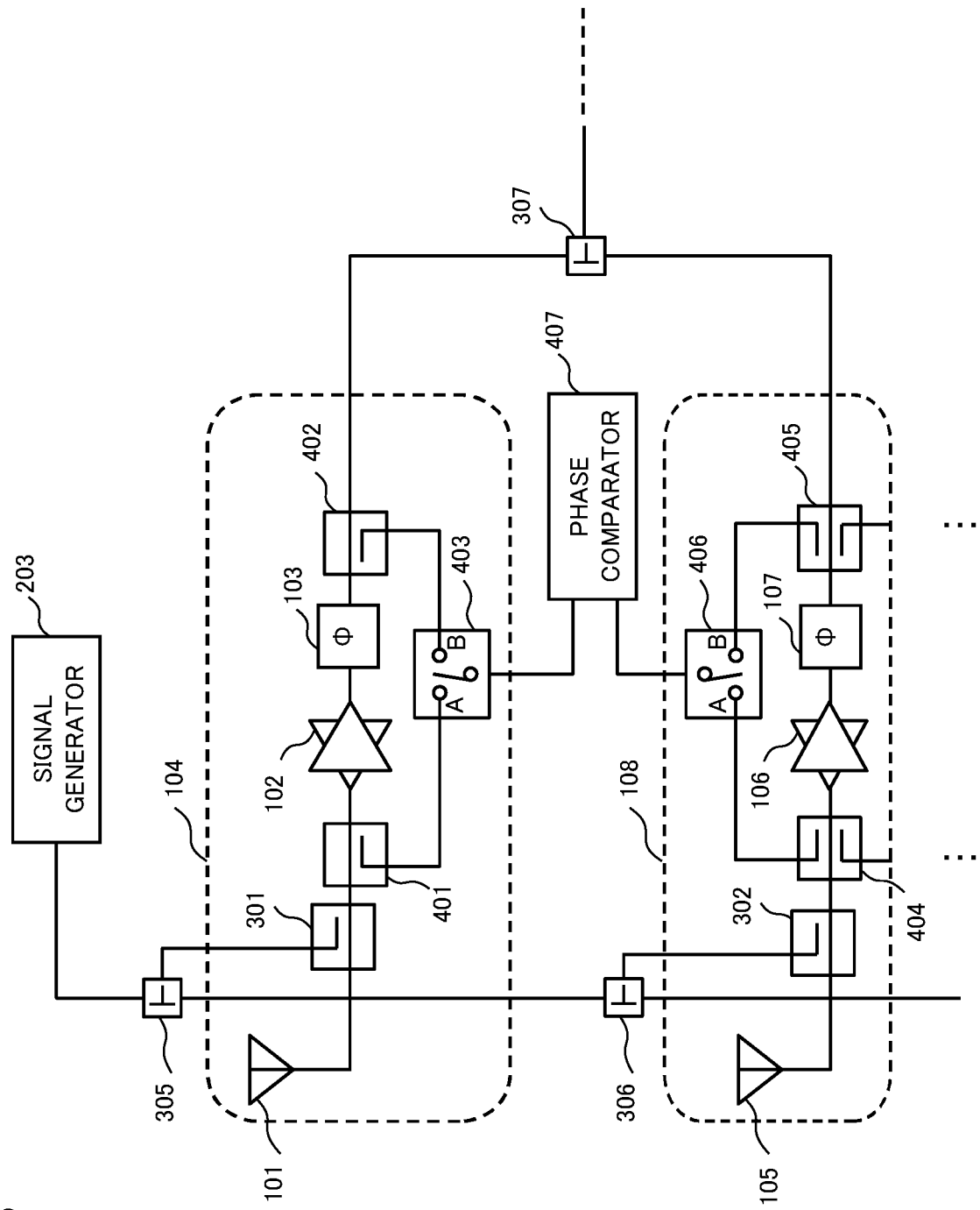
FIG. 3 is a block diagram for illustrating an array communication device according to a second example embodiment.

Next, an array communication device according to a second example embodiment and a method for controlling the same will be described. FIG. 3 is a block diagram for illustrating the array communication device according to the second example embodiment.

The array communication device according to the second example embodiment is a modified example of the array communication device according to the first example embodiment and particularly relates to a configuration in which a phase comparator common to transmission phase calibration and reception phase calibration can be used. A component similar to that in the array communication device in FIG. 2 being a prerequisite for the description of the example embodiment is given the same reference numeral, and detailed description thereof is omitted.

While an amplifier 102 and a phase shifter 103 in a first array unit 104, an amplifier 106 and a phase shifter 107 in a second array unit 108, amplifiers and phase shifters in other unillustrated array units, and a signal generator 203 are controlled by an unillustrated control unit in the present example embodiment as well, illustration of the control unit and detailed description of control by the control unit are omitted.

(Description of Configuration)

The array communication device in FIG. 3 includes the first array unit 104 and the second array unit 108 connected to a signal processing unit in common, each of the first array unit 104 and the second array unit 108 including an antenna, an amplifier, and a phase shifter, similarly to the array communication device in FIG. 2. In FIG. 3, the first array unit 104 includes an antenna 101, the amplifier 102, and the phase shifter 103, and the second array unit 108 includes an antenna 105, the amplifier 106, and the phase shifter 107.

The array communication device in FIG. 3 further includes a phase comparator 407 as an example of a phase comparison means. When transmission phase calibration is performed, the phase comparator 407 compares a phase of a signal branched from between the antenna and the amplifier in the first array unit 104 or the second array unit 108 with a phase of a phase reference signal. When reception phase calibration is performed, the phase comparator 407 compares a phase of a signal branched from an output of the phase shifter in the first array unit 104 or the second array unit 108 with the phase of the phase reference signal.

The array communication device in FIG. 3 further includes the signal generator 203 outputting the phase reference signal, similarly to the first example embodiment.

The array communication device in FIG. 3 further includes a directional coupler 401 as an example of a first directional coupler being placed between the antenna 101 and the amplifier 102 in the first array unit 104 and branching or merging a signal, and a directional coupler 404 as an example of the first directional coupler being placed between the antenna 105 and the amplifier 106 in the second array unit 108 and branching or merging a signal.

The array communication device in FIG. 3 further includes a distributor/combiner 305, a distributor/combiner 306, and a distributor/combiner 307 placed at points where signals are merged or branched, similarly to the first example embodiment. The distributor/combiner 305 is installed between the signal generator 203 and the first array unit 104, and the distributor/combiner 306 is installed between the signal generator 203 and the second array unit 108. The distributor/combiner 307 is placed between the first array unit 104 and the second array unit 108, and the signal processing unit.

The array communication device in FIG. 3 further includes a directional coupler 402 as an example of a second directional coupler being placed in the first array unit 104 and between the phase shifter 103 in the first array unit 104 and the distributor/combiner 307 and branching or merging a signal. The array communication device in FIG. 3 further includes a directional coupler 405 as an example of the second directional coupler being placed in the second array unit 108 and between the phase shifter 107 in the second array unit 108 and the distributor/combiner 307 and branching or merging a signal.

The array communication device in FIG. 3 further includes a directional coupler 301 as an example of a third directional coupler being installed between the directional coupler 401 and the antenna 101 in the first array unit 104 and branching or merging a signal, and a directional coupler 302 as an example of the third directional coupler being installed between the directional coupler 404 and the antenna 105 in the second array unit 108 and branching or merging a signal.

The array communication device in FIG. 3 further includes a single-pole/double-throw switch (SPDT switch) 403 placed between the directional coupler 401 and the directional coupler 402 in the first array unit 104, and the phase comparator 407. The array communication device in FIG. 3 further includes a single-pole/double-throw switch (SPDT switch) 406 placed between the directional coupler 404 and the directional coupler 405 in the second array unit 108, and the phase comparator 407.

Figure 4:
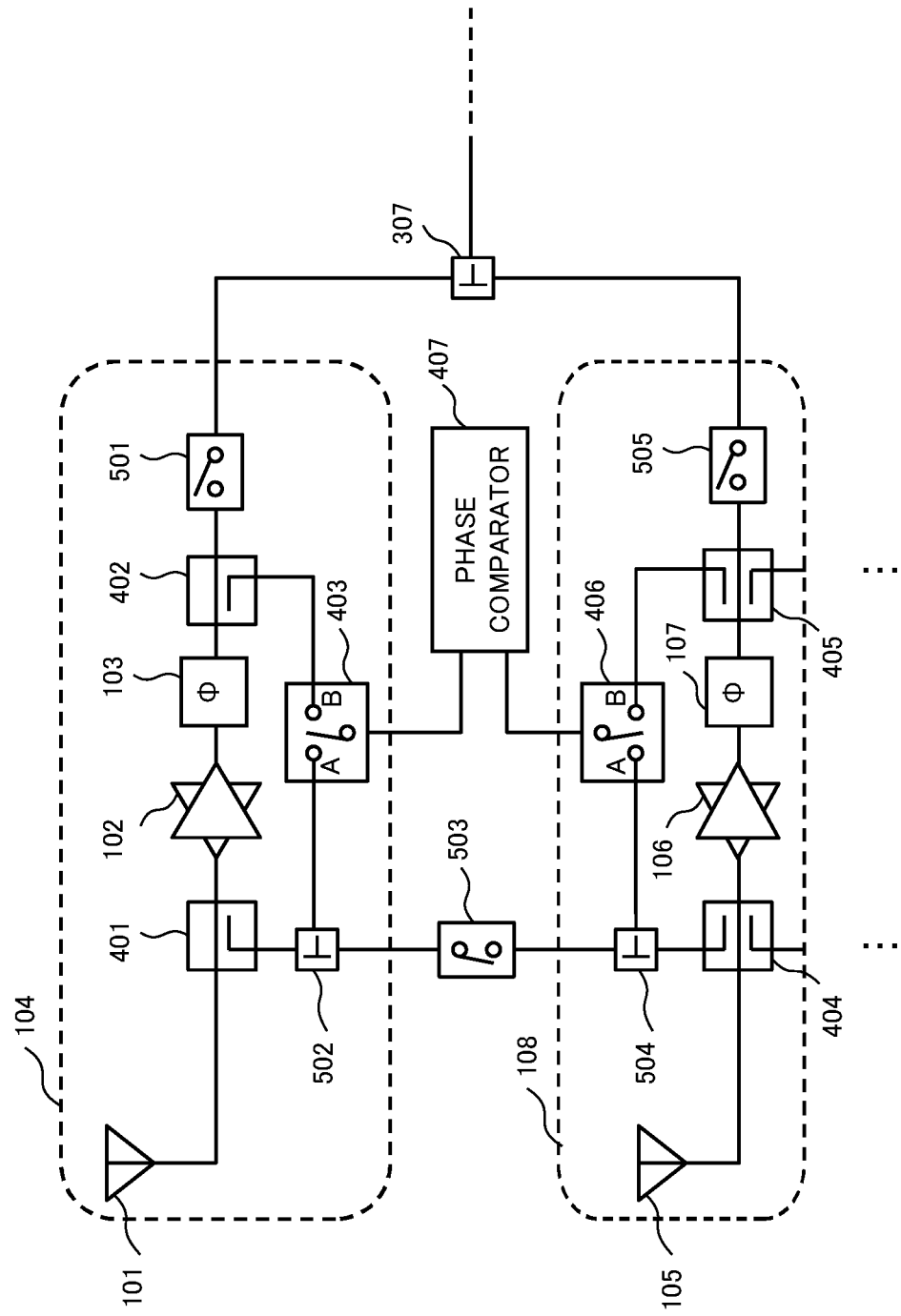
FIG. 4 is a block diagram for illustrating an array communication device according to a third example embodiment.
Figure 5:
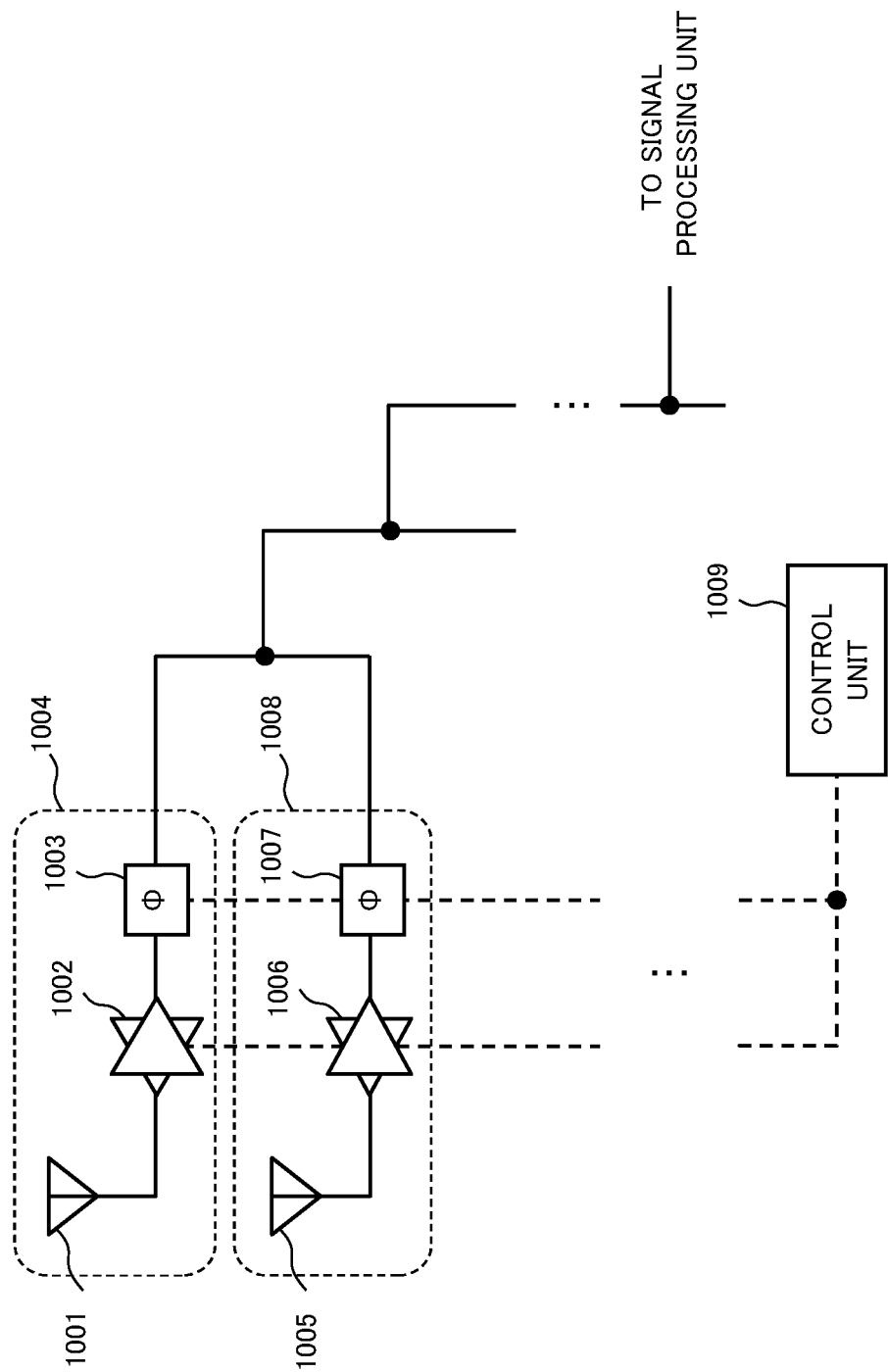
FIG. 5 is a block diagram for illustrating an array communication device based on the background art.

While illustration is omitted in FIG. 4, when a third array unit is placed next to the second array unit 108, a separate SPDT switch is placed between the directional coupler 404 and the directional coupler 405 in the second array unit 108, and the phase comparator, and by changing the setting of the SPDT switch, either one of a signal from the directional coupler 404 in the second array unit 108 and a signal from the directional coupler 405 is input to the phase comparator, and phases are compared.

(Description of Operation)

In order to support phase calibration for both transmission and reception, the array communication device in FIG. 3 is provided with the directional coupler 301, the directional coupler 302, the directional coupler 401, and the directional coupler 404. In the transmission phase calibration, the SPDT switch 403 and the SPDT switch 406 are electrically continuous with the directional coupler 401 and the directional coupler 404, respectively (electrically continuous with a contact A in FIG. 3). Then, in the reception phase calibration, the SPDT switch 403 and the SPDT switch 406 are electrically continuous with the directional coupler 402 and the directional coupler 405, respectively (electrically continuous with a contact B in FIG. 3).

In the reception phase calibration, a known phase reference signal from the signal generator 203 is transmitted to the first array unit 104 and the second array unit 108 through the distributor/combiner 305 and the distributor/combiner 306. The signals received by the first array unit 104 and the second array unit 108 are output to an unillustrated signal processing unit through the amplifier 102, the amplifier 106, the phase shifter 103, the phase shifter 107, the distributor/combiner 307, and the like. At this time, by inputting part of the signal to the phase comparator 407 through the directional coupler 402, the directional coupler 405, the SPDT switch 403, and the SPDT switch 406, the signals from the signal generator 203 are compared. This enables detection of the phase difference between the arrays.

(Description of Advantageous Effects)

The array communication device in FIG. 3 enables phase/amplitude calibration between arrays for each of the transmission operation and the reception operation of the bi-directionally configured array communication device. Use of the phase comparator 407 particularly enables each of phase calibration in the transmission operation of the bi-directionally configured array communication device and phase calibration in the reception operation.

With such a configuration, a device size of the bi-directionally configured array communication device capable of phase/amplitude calibration between arrays can be reduced.

Furthermore, the array communication device in FIG. 3 can compare the phase difference between arrays such as between the first array unit 104 and the second array unit 108 by the phase comparator 407 for both transmission and reception and can individually perform phase calibration for transmission and reception. This enables detection of the phase difference between adjoining arrays such as between the first array unit 104 and the second array unit 108 and between the second array unit 108 and an unillustrated third array unit and enables phase calibration for both transmission and reception.

Third Example Embodiment

Next, an array communication device according to a third example embodiment and a method for controlling the same will be described. FIG. 4 is a block diagram for illustrating the array communication device according to the third example embodiment. The array communication device according to the third example embodiment is a modified example of the array communication device according to the second example embodiment and is related to a configuration in which loopback between arrays in a bi-directional configuration is performed. A component similar to that in the array communication device in FIG. 3 being a prerequisite for the description of the example embodiment is given the same reference numeral, and detailed description thereof is omitted.

While an amplifier 102 and a phase shifter 103 in a first array unit 104, an amplifier 106 and a phase shifter 107 in a second array unit 108, amplifiers and phase shifters in other unillustrated array units, and a signal generator 203 are controlled by an unillustrated control unit in the present example embodiment as well, illustration of the control unit and detailed description of control by the control unit are omitted.

(Description of Configuration)

The array communication device in FIG. 4 includes the first array unit 104 and the second array unit 108 connected to a signal processing unit in common, each of the first array unit 104 and the second array unit 108 including an antenna, an amplifier, and a phase shifter, similarly to the array communication device in FIG. 3. In FIG. 4, the first array unit 104 includes an antenna 101, the amplifier 102, and the phase shifter 103, and the second array unit 108 includes an antenna 105, the amplifier 106, and the phase shifter 107.

The array communication device in FIG. 4 further includes a phase comparator 407 as an example of a phase comparison means, similarly to the array communication device in FIG. 3. When transmission phase calibration is performed, the phase comparator 407 compares a phase of a signal branched from between the antenna and the amplifier in the first array unit 104 or the second array unit 108 with a phase of a phase reference signal. When reception phase calibration is performed, the phase comparator 407 compares a phase of a signal branched from an output of the phase shifter in the first array unit 104 or the second array unit 108 with the phase of the phase reference signal.

The array communication device in FIG. 4 further includes a directional coupler 401 as an example of a first directional coupler being placed between the antenna 101 and the amplifier 102 in the first array unit 104 and branching or merging a signal and a directional coupler 402 as an example of the first directional coupler being placed between the antenna 105 and the amplifier 106 in the second array unit 108 and branching or merging a signal.

The array communication device in FIG. 4 further includes a directional coupler 402 as an example of a second directional coupler being placed in the first array unit 104 and between the phase shifter 103 in the first array unit 104 and a distributor/combiner 307 and branching or merging a signal, similarly to the second example embodiment. The array communication device in FIG. 4 further includes a directional coupler 405 as an example of the second directional coupler being placed in the second array unit 108 and between the phase shifter 107 in the second array unit 108 and the distributor/combiner 307 and branching or merging a signal.

The array communication device in FIG. 4 further includes a switch 501 inserted between the directional coupler 402 and the distributor/combiner 307, and a switch 505 inserted between the directional coupler 405 and the distributor/combiner 307.

The array communication device in FIG. 4 further includes the distributor/combiner 307, a distributor/combiner 502, and a distributor/combiner 504 placed at points where signals are merged or branched. The distributor/combiner 307 is placed between the first array unit 104 and the second array unit 108, and the signal processing unit.

The array communication device in FIG. 4 further includes a single-pole/double-throw switch (SPDT switch) 403 placed between the directional coupler 401 and the directional coupler 402 in the first array unit 104, and the phase comparator 407. The array communication device in FIG. 4 further includes a single-pole/double-throw switch (SPDT switch) 406 placed between the directional coupler 404 and the directional coupler 405 in the second array unit 108, and the phase comparator 407.

The array communication device in FIG. 4 further includes a switch 503 inserted between a coupling port of the directional coupler 401 in the first array unit 104 and a coupling port of the directional coupler 404 in the second array unit 108.

While illustration is omitted in FIG. 4, when a third array unit next to the second array unit 108 is placed, a separate SPDT switch is placed between the directional coupler 404 through a distributor/combiner and the directional coupler 405 in the second array unit 108, and by changing the setting of the SPDT switch, either one of a signal from the directional coupler 404 in the second array unit 108 and a signal from the directional coupler 405 is input to the phase comparator, and phases are compared.

(Description of Operation)

In the example embodiments described above, a referential signal being a reference in the reception phase calibration is generated by a signal generator or is externally transmitted. On the other hand, the configuration according to the present example embodiment performs loopback between arrays in a bi-directional configuration.

First, a case of performing the transmission phase calibration in the array communication device in FIG. 4 will be described. When the transmission phase calibration is performed, the switches 501 and 505 are turned on and the switch 503 is turned off. Further, the SPDT switch 403 and the SPDT switch 406 are electrically continuous with the distributor/combiner 502 and the distributor/combiner 504, respectively.

As for the first array unit 104, a transmission signal from the unillustrated signal processing unit distributed by the distributor/combiner 307 is input to the phase comparator 407 from the distributor/combiner 502 through the switch 501, the directional coupler 402, the phase shifter 103, the amplifier 102, and the directional coupler 401. As for the second array unit 108, the transmission signal from the unillustrated signal processing unit distributed by the distributor/combiner 307 is input to the phase comparator 407 from the distributor/combiner 504 through the switch 505, the directional coupler 405, the phase shifter 107, the amplifier 106, and the directional coupler 404. The above enables detection of the phase difference between arrays such as between the first array unit 104 and the second array unit 108.

Next, a case of performing the reception phase calibration in the array communication device in FIG. 4 will be described. Assuming that a reception phase in the second array unit 108 is calibrated with reference to a transmission phase in the first array unit 104, the switch 501 and the switch 503 are turned on, and the switch 505 is turned off. The SPDT switch 403 is electrically continuous with the distributor/combiner 502, and the SPDT switch 406 is electrically continuous with the directional coupler 405.

The transmission signal from the unillustrated signal processing unit is distributed to the switches 501 and 505 through the distributor/combiner 307; however, since the switch 505 is turned off, the signal is not transferred. On the other hand, the signal passing through the switch 501 is input to the distributor/combiner 502 through the directional coupler 402, the phase shifter 103, the amplifier 102, and the directional coupler 401.

The output of the distributor/combiner 502 is split to a path input to the phase comparator 407 through the SPDT switch 403 and a path input to the phase comparator 407 through the switch 503, the distributor/combiner 504, and the directional coupler 404, and further through the amplifier 106, the phase shifter 107, the directional coupler 405, and the SPDT switch 406. At this time, the phase comparator 407 can compare a transmission phase in the first array unit 104 with a reception phase in the second array unit 108.

When the operations of the first array unit 104 and the second array unit 108 are reversed, a reception phase in the first array unit 104 can be calibrated by a transmission phase in the second array unit 108. Specifically, when the reception phase in the first array unit 104 is calibrated with reference to the transmission phase in the second array unit 108, the switch 505 and the switch 503 are turned on, and the switch 501 is turned off.

Assuming that transmission phase calibration between a plurality of arrays is separately completed, a reception phase can be calibrated with reference to a transmission phase between arrays. A power detector and a variable gain amplifier may be provided in order to adjust strength of signals input to the phase comparator 407 from the second array unit 108 and the first array unit 104 during calibration of a reception array. The switches installed on main signal paths, such as the switch 501 and the switch 505, have high high-frequency loss and therefore may be replaced by on-off controllable bi-directional amplifiers.

(Description of Advantageous Effects)

The array communication device in FIG. 4 can individually perform phase/amplitude calibration between arrays for the transmission operation and the reception operation of the bi-directionally configured array communication device. Use of the phase comparator 407 particularly enables phase calibration in the transmission operation of the bi-directionally configured array communication device and phase calibration in the reception operation to be individually performed, similarly to the second example embodiment.

With such a configuration, a device size of the bi-directionally configured array communication device capable of phase/amplitude calibration between arrays can be reduced.

Furthermore, the array communication device in FIG. 4 can compare the phase difference between arrays such as between the first array unit 104 and the second array unit 108 by the phase comparator 407 for both transmission and reception and can individually perform phase calibration for transmission and reception, similarly to the second example embodiment. This enables detection of the phase difference between adjoining arrays such as between the first array unit 104 and the second array unit 108 and between the second array unit 108 and an unillustrated third array unit and enables phase calibration for both transmission and reception.

Furthermore, by providing a loopback path between arrays such as the switch 503, the distributor/combiner 502, and the distributor/combiner 504, the array communication device in FIG. 4 can calibrate a reception phase in the second array unit 108 with reference to a transmission phase in the first array unit 104 and calibrate a reception phase in the first array unit 104 with reference to a transmission phase in the second array unit 108. This eliminates the need for the signal generator 203 in FIG. 2 and FIG. 3 used for phase calibration in the array communication device and eliminates the need for a referential signal being a reference to be externally transmitted for phase calibration.

While the preferred example embodiments of the present invention have been described above, the present invention is not limited thereto. It goes without saying that various modifications may be made within the scope of the invention described in the claims and such modifications are also included in the scope of the present invention.

The whole or part of the example embodiments disclosed above can be described as, but not limited to, the following supplementary notes.

(Supplementary Note 1)

An array communication device comprising:

a plurality of array units connected to a signal processing unit in common, each of the array units including an antenna, an amplifier, and a phase shifter;

a first directional coupler placed between the antenna and the amplifier in the array unit and branching or merging a signal;

a second directional coupler placed between the phase shifter in the array unit and the signal processing unit and branching or merging a signal; and a phase comparison means for comparing a phase of at least one of signals from the first directional coupler and the second directional coupler with a phase of a phase reference signal, the signals input to the phase comparison means, and calibrating a phase.

(Supplementary Note 2)

The array communication device according to Supplementary Note 1, wherein the second directional coupler is placed in the array unit and between the phase shifter in the array unit and the signal processing unit and branches or merges a signal.

(Supplementary Note 3)

The array communication device according to Supplementary Note 2, wherein each of the plurality of array units further includes a first switch placed between the first directional coupler and the second directional coupler and switching between a path from the first directional coupler to the phase comparison means and a path from the second directional coupler to the phase comparison means.

(Supplementary Note 4)

The array communication device according to Supplementary Note 3, further comprising a second switch placed between a first directional coupler in one array unit out of the plurality of array units and a first directional coupler in another array unit out of the plurality of array units.

(Supplementary Note 5)

The array communication device according to Supplementary Note 3, further comprising a third directional coupler placed between a first directional coupler and the antenna in one array unit out of the plurality of array units and branching or merging a signal.

(Supplementary Note 6)

The array communication device according to Supplementary Note 5, further comprising a signal generator outputting the phase reference signal, wherein a path length from the signal generator to the third directional coupler in the array unit is equal between one array unit and another array unit out of the plurality of array units.

(Supplementary Note 7)

The array communication device according to Supplementary Note 1, wherein the phase comparison means includes a first phase comparator and a second phase comparator, the first phase comparator compares a phase of the phase reference signal with a phase of a signal from the first directional coupler in one array unit out of the plurality of array units, the signals input to the first phase comparator, and the second phase comparator compares a phase of the phase reference signal with a phase of a signal from the second directional coupler in one array unit out of the plurality of array units, the signals input to the second phase comparator.

(Supplementary Note 8)

The array communication device according to Supplementary Note 1 or 7, wherein the phase comparison means compares a phase of a signal from the second directional coupler in one array unit out of the plurality of array units, the phase reference signal being supplied to the second directional coupler through the amplifier and the phase shifter, with a phase of a signal from the second directional coupler in another array unit out of the plurality of array units, the phase reference signal being supplied to the second directional coupler through the amplifier and the phase shifter, the signals being input to the phase comparison means.

(Supplementary Note 9)

The array communication device according to Supplementary Note 1, 7, or 8, further comprising a signal generator outputting the phase reference signal, wherein a path length from the signal generator to the first directional coupler in the array unit is equal between one array unit and another array unit out of the plurality of array units.

(Supplementary Note 10)

An array communication device control method for controlling an array communication device including:

a plurality of array units connected to a signal processing unit in common, each of the array units having an antenna, an amplifier, and a phase shifter;

a first directional coupler placed between the antenna and the amplifier in the array unit and branching a signal; and a second directional coupler placed in the array unit and between the phase shifter in the array unit and the signal processing unit and branching part of a signal, the method comprising comparing a phase of at least one of input signals from the first directional coupler and the second directional coupler with a phase of an input phase reference signal and calibrating a phase, based on a comparison result.

(Supplementary Note 11)

The array communication device control method according to Supplementary Note 10, wherein the array communication device further includes a switch placed between a first directional coupler in one array unit out of the plurality of array units and a first directional coupler in another array unit out of the plurality of array units, the method further comprising performing phase calibration between array units by use of a signal supplied from one array unit out of the plurality of array units to another array unit out of the plurality of array units through the switch.

(Supplementary Note 12)

The array communication device control method according to Supplementary Note 10, further comprising comparing a phase of an input signal from the first directional coupler or the second directional coupler with a phase of an input phase reference signal and calibrating a phase, based on a comparison result.

While the invention has been particularly shown and described with reference to exemplary example embodiments thereof, the invention is not limited to these example embodiments. It will be understood by those of ordinary skill in the art that various changes in form and details may be made therein without departing from the spirit and scope of the present invention as defined by the claims.

This application is based upon and claims the benefit of priority from Japanese patent application No. 2018-95602, filed on May 17, 2018, the disclosure of which is incorporated herein in its entirety by reference.

REFERENCE SIGNS LIST 101, 105 Antenna
102, 106 Amplifier
103, 107 Phase shifter
104 First array unit
108 Second array unit
109 Control unit
110 Signal processing unit
201, 403, 406 SPDT switch
202, 204, 407 Phase comparator
203 Signal generator
301, 302, 303, 401, 402, 404, 405 Directional coupler
304, 305, 306, 307, 308, 309, 502, 504 Distributor/combiner
310, 311, 501, 503, 505 Switch

The invention claimed is:

1. An array communication device comprising:
a plurality of array units connected to a signal processing unit in common, each of the array units including an antenna, an amplifier, and a phase shifter;
a first directional coupler placed between the antenna and the amplifier in the array unit and configured to branch or merge a signal;
a second directional coupler placed between the phase shifter in the array unit and the signal processing unit and configured to branch or merge a signal; and
a phase comparison unit configured to compare a phase of at least one of signals from the first directional coupler and the second directional coupler with a phase of a phase reference signal, the signals being input to the phase comparison unit, and configured to calibrate a phase,
wherein each of the plurality of array units further includes a first switch placed between the first directional coupler and the second directional coupler and configured to switch between a path from the first directional coupler to the phase comparison unit and a path from the second directional coupler to the phase comparison unit.

2. The array communication device according to claim 1, wherein the second directional coupler is placed in the array unit and between the phase shifter in the array unit and the signal processing unit and is configured to branch or merge a signal.

3. The array communication device according to claim 2, further comprising:
a second switch placed between a first directional coupler in one array unit out of the plurality of array units and a first directional coupler in another array unit out of the plurality of array units.

4. The array communication device according to claim 2, further comprising:
a third directional coupler placed between a first directional coupler and the antenna in one array unit out of the plurality of array units and configured to branch or merge a signal.

5. The array communication device according to claim 4, further comprising:
a signal generator configured to output the phase reference signal,
wherein a path length from the signal generator to the third directional coupler in the array unit is equal between one array unit and another array unit out of the plurality of array units.

6. The array communication device according to claim 1, wherein the phase comparison unit includes a first phase comparator and a second phase comparator,
wherein the first phase comparator is configured to compare a phase of the phase reference signal with a phase of a signal from the first directional coupler in one array unit out of the plurality of array units, the signals being input to the first phase comparator, and
wherein the second phase comparator is configured to compare a phase of the phase reference signal with a phase of a signal from the second directional coupler in one array unit out of the plurality of array units, the signals being input to the second phase comparator.

7. The array communication device according to claim 1, wherein the phase comparison unit is configured to compare a phase of a signal from the second directional coupler in one array unit out of the plurality of array units, the phase reference signal being supplied to the second directional coupler through the amplifier and the phase shifter, with a phase of a signal from the second directional coupler in another array unit out of the plurality of array units, the phase reference signal being supplied to the second directional coupler through the amplifier and the phase shifter, the signals being input to the phase comparison unit.

8. The array communication device according to claim 1, further comprising:
a signal generator configured to output the phase reference signal,
wherein a path length from the signal generator to the first directional coupler in the array unit is equal between one array unit and another array unit out of the plurality of array units.

9. An array communication device control method for controlling an array communication device including:
a plurality of array units connected to a signal processing unit in common, each of the array units having an antenna, an amplifier, and a phase shifter;
a first directional coupler being placed between the antenna and the amplifier in the array unit and branching a signal;
a second directional coupler being placed in the array unit and between the phase shifter in the array unit and the signal processing unit and branching part of a signal; and
a phase comparison unit,
wherein each of the plurality of array units further includes a first switch placed between the first directional coupler and the second directional coupler and configured to switch between a path from the first directional coupler to the phase comparison unit and a path from the second directional coupler to the phase comparison unit, and
wherein the method comprises:
comparing by the phase comparison unit a phase of at least one of input signals from the first directional coupler and the second directional coupler with a phase of an input phase reference signal, and calibrating a phase, based on a comparison result.

10. The array communication device control method according to claim 9, wherein the array communication device further includes a switch placed between a first directional coupler in one array unit out of the plurality of array units and a first directional coupler in another array unit out of the plurality of array units,
wherein the method further comprises:
performing phase calibration between array units by use of a signal supplied from one array unit out of the plurality of array units to another array unit out of the plurality of array units through the switch.

11. The array communication device control method according to claim 9, further comprising:
comparing a phase of an input signal from the first directional coupler or the second directional coupler with a phase of an input phase reference signal and calibrating a phase, based on a comparison result.

* * * * *